US006701488B2

(12) United States Patent
Amick et al.

(10) Patent No.: US 6,701,488 B2

(45) Date of Patent: Mar. 2, 2004

(54) REDUCING I/O SUPPLY NOISE WITH DIGITAL CONTROL

(75) Inventors: Brian W. Amick, Austin, TX (US); Claude R. Gauthier, Fremont, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 113 days.

(21) Appl. No.: 09/992,607

(22) Filed: Nov. 14, 2001

(65) Prior Publication Data

US 2003/0090310 A1 May 15, 2003

(51) Int. Cl.$^7$ ................................ G06F 17/50

(52) U.S. Cl. ................................ 716/1

(58) Field of Search ................................ 716/1

(56) References Cited

U.S. PATENT DOCUMENTS

| | | | | | |
|---|---|---|---|---|---|
| 5,926,353 | A | * | 7/1999 | Misek | 361/56 |
| 6,028,449 | A | * | 2/2000 | Schmitt | 326/80 |
| 6,071,003 | A | * | 6/2000 | Ashuri et al. | 716/6 |
| 6,184,557 | B1 | * | 2/2001 | Poplevine et al. | 257/358 |
| 6,388,503 | B1 | * | 5/2002 | Maloney | 327/384 |
| 6,556,409 | B1 | * | 4/2003 | Chittipeddi et al. | 361/111 |

* cited by examiner

*Primary Examiner*—Leigh M. Garbowski
*Assistant Examiner*—Brandon Bowers
(74) *Attorney, Agent, or Firm*—Rosenthal & Osha L.L.P.

(57) ABSTRACT

A method for reducing noise in an I/O system has been developed. The method includes powering up the I/O supply and activating or inserting a shunting resistance across the power supply terminals. The shunting resistance is inserted in parallel with the I/O power supply, and is controllable such that the resistance can be selectively switched 'on' and/or 'off.'

9 Claims, 4 Drawing Sheets

REDUCING I/O SUPPLY NOISE WITH DIGITAL CONTROL

BACKGROUND OF INVENTION

1. Field of the Invention

The invention relates generally to circuit design. More particularly, this invention relates to a technique for reducing I/O supply noise.

2. Background Art

In electronic circuits, an input/output ("I/O") supply can be shown as an equivalent circuit 10 as shown in FIG. 1. A typical I/O supply generates and receives high and low data bits dependent on inputs to one or more transceiver devices within the I/O supply. Specifically, the equivalent circuit 10 includes a power supply source 12, a supply resistance (Rs) 14, a supply inductance (Ls) 16, and transceiver circuits 18 and 19. Each of these system components 12, 14, 16, 18, and 19 represent an equivalent value of all of the combined respective components in the I/O supply. The performance of the circuit 10 is frequency dependent. As shown in the graph of FIG. 2, as the frequency of the system increases, the impedance of the circuit increases as well. This increase in impedance 24 continues until a peak 20 is reached at a resonance frequency. Finally, the impedance will subside at even higher frequencies.

The rate of increase in the impedance of the circuit as the frequency approaches its resonance value is quantified as a "Q" value. The "Q" value is calculated as $Q=((L/C))/R$; where L is the system inductance value; where C is the system capacitance value; and where R is the system resistance value. As shown in FIG. 2, under normal operations, the equivalent circuit 10 has a very high Q value 24 near the resonance frequency. A high current transient within the high Q region of the frequency band causes significant noise in the I/O supply system. Supply noise can result in such problems as voltage variation, signal jitter, signal stability, component or logic malfunction, signal interference, etc. For instance, a logic device operatively connected to the I/O supply will have more jitter in the presence of I/O supply noise, which effectively leads to a reduction in the speed at which an integrated circuit can operate. Further, Voltage variation is a significant problem because the indeterministic distribution of power to system components can lead to a loss of system performance.

It would be advantageous to decrease the Q value of the I/O supply system and thereby reduce I/O supply noise. A reduced Q value 26 is also shown in FIG. 2. This Q value 26 would have the advantage of substantially reducing the noise of the respective system. FIG. 3 shows a prior art method of reducing the Q value for an I/O supply system 32. The prior art method used in FIG. 3 involves inserting a de-coupling capacitor 34 across the power supply of the I/O supply 32 in order to increase the system capacitance. However, the capacitor 34 takes up a significant amount of space on the chip.

Another phenomenon inherent in the design of a typical I/O supply system is inefficient signal current flow. FIG. 4*a* shows the flow of current when the I/O supply system 10 is driving a high value. In driving a high value to a transmission line 33, the I/O supply system 10 actually sinks some current in addition to sourcing enough current to drive the transmission line 33 high. As shown by the dotted arrow line in FIG. 4*a*, the sunk current from the transmission line 33 must flow around the I/O supply system 10. Typically, current flow in such a manner faces high impedance, especially when current has to flow through a voltage source 12, as shown in FIG. 4*a*. Thus, current flow in the typical I/O supply system 10 experiences high impedance, a performance degrading effect.

FIG. 4*b* shows the flow of current from the transmission line 33 when the I/O supply system 32 has a capacitor 34 positioned across the I/O power supply 12. In this case, current from the transmission line 33 flows through the equivalent circuit of the I/O supply system 12 and the capacitor loop as shown in FIG. 4*b*. This phenomenon also results in non-optimal performance in that a significant portion of the current flowing from the transmission line 33 into the I/O supply system 12 still experiences high impedance.

Thus, there is a need for an I/O supply system that provides a low impedance current flow path, effectively leading to performance improvement. Further, there is a need for a space efficient method of reducing voltage variation for a I/O supply system.

SUMMARY OF INVENTION

According to one aspect of the present invention, a method for reducing noise in an I/O supply comprises supplying current to an I/O supply output from a power supply and connecting a shunting device in parallel with the power supply of the I/O supply, where a portion of the current supplied to the I/O supply output flows through the shunting device.

According to another aspect, an I/O supply comprises a power supply, an I/O output selectively driven by the power supply, and a shunting device connected in parallel with the power supply.

According to another aspect, an apparatus for reducing noise in an I/O supply comprises means for supplying current to an I/O supply output from a power supply and means for connecting a shunting device in parallel with the power supply of the I/O supply, where a portion of the current supplied to the I/O supply output flows through the shunting device.

Other aspects and advantages of the invention will be apparent from the following description and the appended claims.

DETAILED DESCRIPTION

Figure 1:
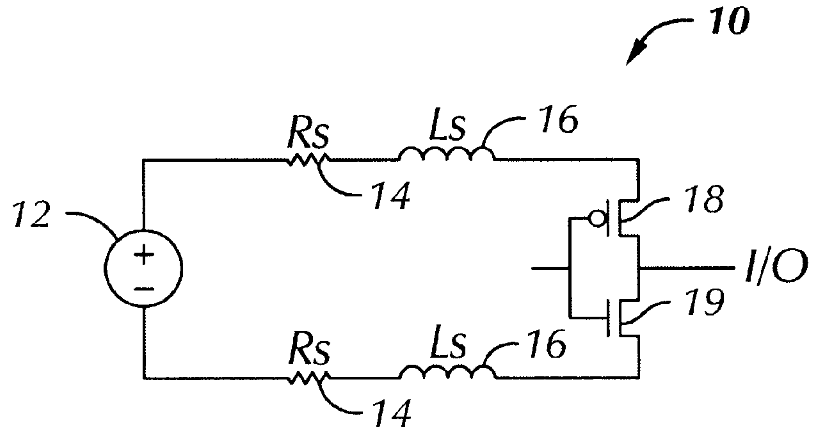
FIG. 1 shows a prior art embodiment of an equivalent circuit for a I/O supply system.
Figure 2:
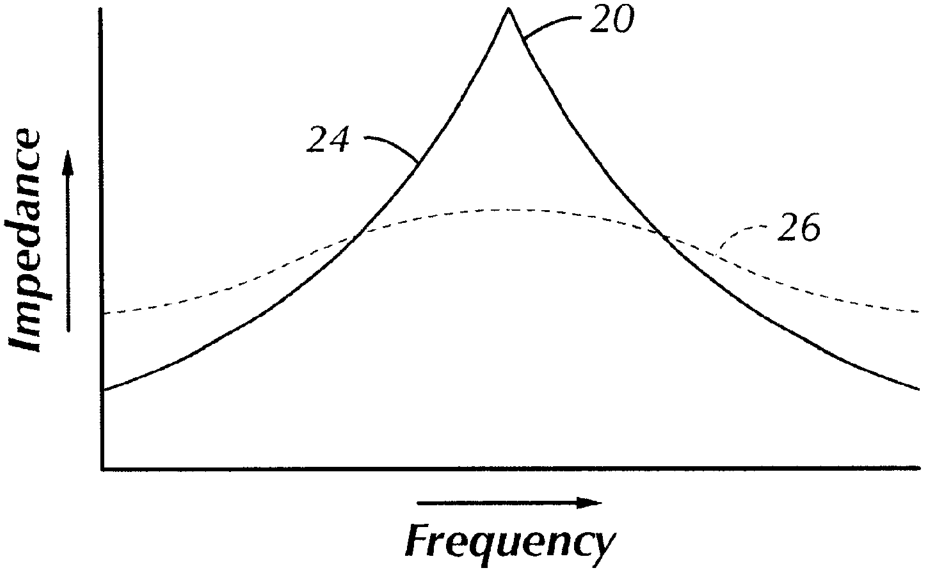
FIG. 2 shows a prior art graph of impedance versus frequency for the circuit shown in FIG. 1.
Figure 3:
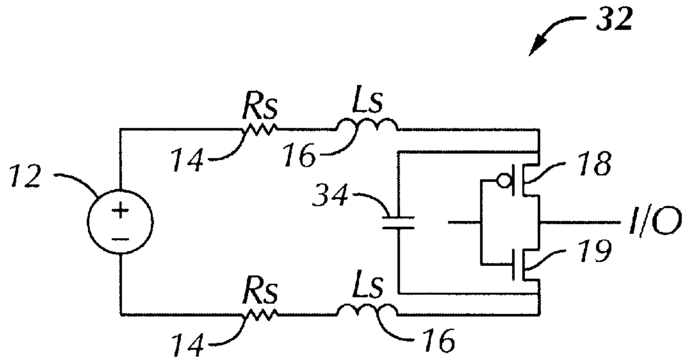
FIG. 3 shows a prior art schematic of a I/O supply system with a decoupling capacitor.
Figure 4A:
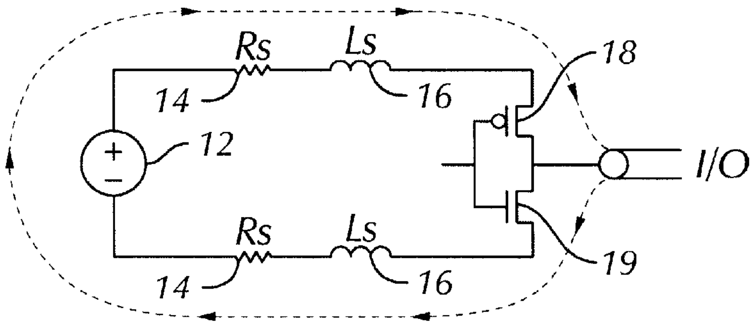
FIG. 4*a* shows current flow in a typical I/O supply system.
Figure 4B:
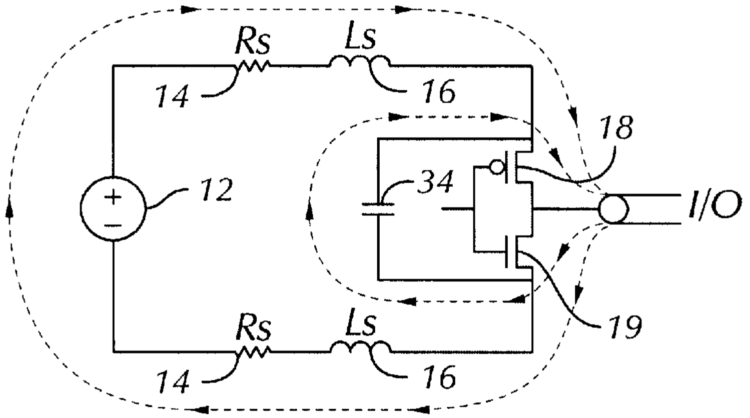
FIG. 4*b* shows current flow in a typical I/O supply system having a decoupling capacitor.
Figure 5:
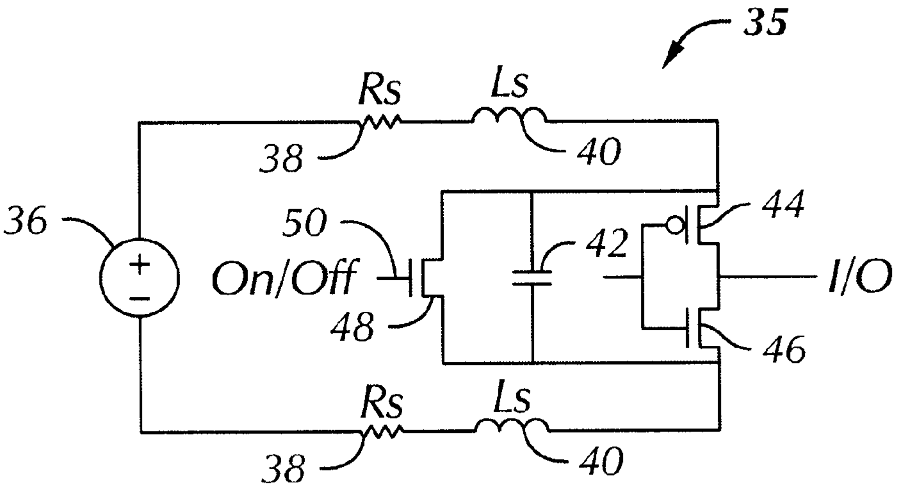
FIG. 5 shows a shunting resistance in accordance with an embodiment of the present invention.

FIG. 5 shows a schematic of an I/O supply 35 having a shunting resistance in accordance with an embodiment of the present invention. The I/O supply includes: a power supply 36, a system resistance (Rs) 38, a system inductance (Ls) 40, a decoupling capacitor 42, transceiver circuits 44 and 46, and a shunting device 48. The shunting device 48 is positioned in parallel with the transceiver circuits 44 and 46. In this embodiment, the shunting device 48 is shown as an N-type transistor which means that the transistor is "on" (allows current to pass) when an ON/OFF, i.e., digital, signal 50 is "high." Conversely, the transistor 48 is "off" (does not allow current to pass) when the ON/OFF signal 50 is "low."

The effect of adding a resistance value in parallel to the transceiver circuits is to lower the Q value and consequently lower the noise in the I/O supply 35. Decreasing the noise in the I/O supply 35 leads to increased predictability and less jitter on a signal transmitted by the I/O supply 35. Those skilled in the art will appreciate that a reduction of noise by 50% may result in a corresponding reduction in jitter of 50%. In this embodiment, a transistor is used to provide a small amount of resistance to lower the Q value of the I/O supply. In this embodiment, the transistor is controlled with an ON/OFF signal 50. When the ON signal is activated, the transistor makes a connection in parallel across the power supply 36 of the I/O supply 35. The connection allows current to flow through the transistor, which acts as a relatively small resistor.

Figure 6:
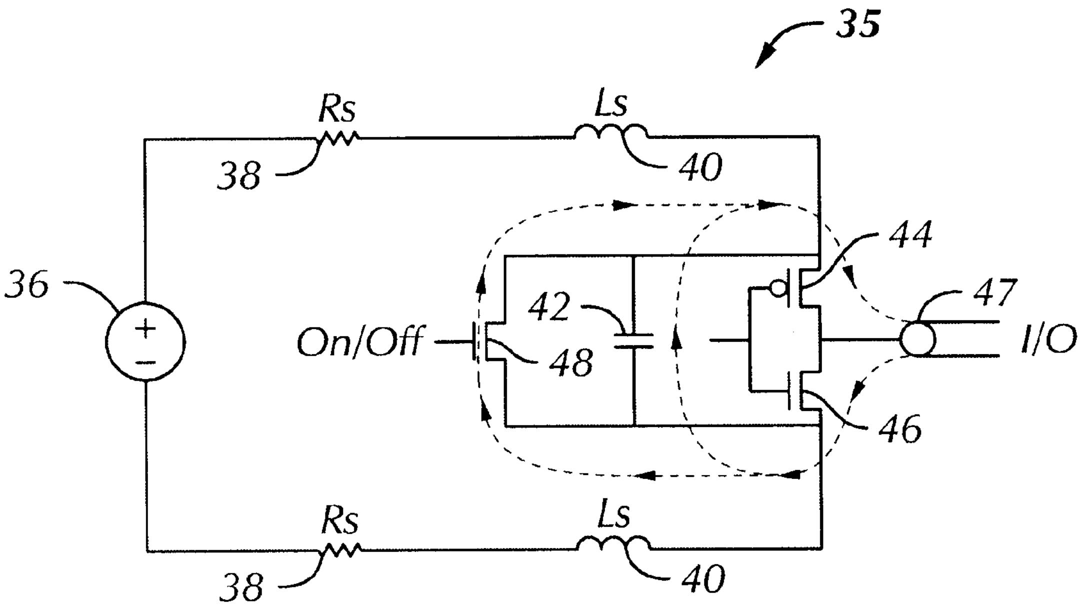
FIG. 6 shows current flow in accordance with the embodiment shown in FIG. 5.

FIG. 6 shows the flow of signal current when the I/O supply 35 drives a transmission line 47 high. In this case, current flows from the I/O supply 35 to the transmission line 47. However, some current flows back into the I/O supply 35 from the transmission line 47. This current, as indicated by the dotted arrow line in FIG. 6, flows through the shunting device 48 and capacitor 42 paths. Those skilled in the art will appreciate that the flow of current as shown in FIG. 6 experiences much less impedance than in the conventional I/O supply where the current would have to flow through an I/O power supply and/or additional inductances and resistances. Although the transmission line is referenced low in the embodiment shown in FIG. 6, those skilled in the art will appreciate that the present invention also provides current flow benefits when the I/O supply drives low and the transmission line is referenced high. Further, if the transmission line is capable of being referenced to both high and low, then the present invention provides less impedance to current flow when driving both high and low.

Figure 7:
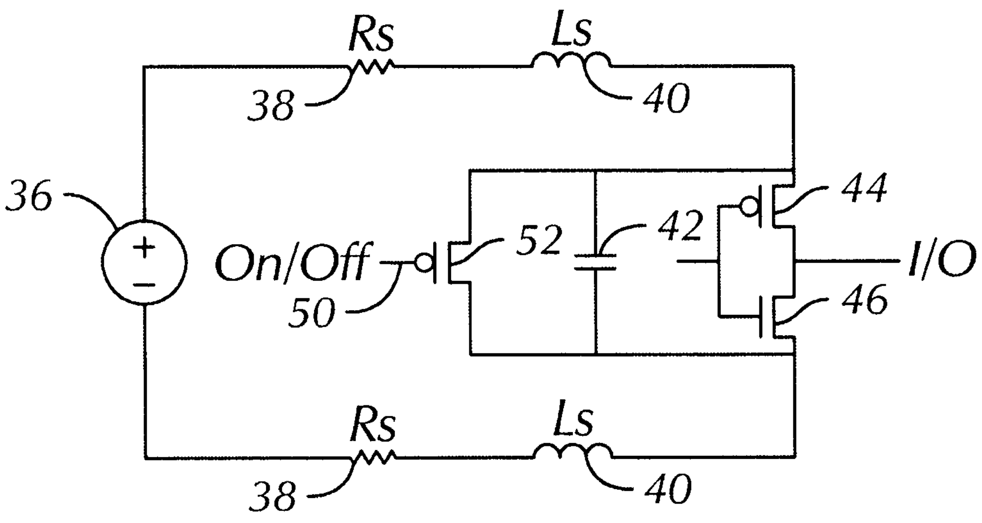
FIG. 7 shows a shunting resistance in accordance with an another embodiment of the present invention.

FIG. 7 shows a schematic of a I/O supply 35 having a shunting device in accordance with another embodiment of the present invention. The I/O supply 35 includes a power supply 36, a system resistance (Rs) 38, a system inductance (Ls) 40, a decoupling capacitor 42, transceiver circuits 44 and 46, and a shunting device 52. The shunting device 52 is positioned in parallel with the transceiver circuits 44 and 46. In this embodiment, the shunting device 52 is shown as a P-type transistor which means that the transistor is "on" (allows current to pass) when an ON/OFF, i.e., digital, signal 50 is "low." Conversely, the transistor 52 is "off" (does not allow current to pass) when the ON/OFF signal 50 is "high."

The P-type transistor operates in the same manner as the N-type transistor, except that it is activated off by the inverse signals. Consequently, the circuit in shown in FIG. 7 will operate in the same manner as the circuit in FIG. 5 except that it will be turned ON and turned OFF by inverted signals.

Figure 8:
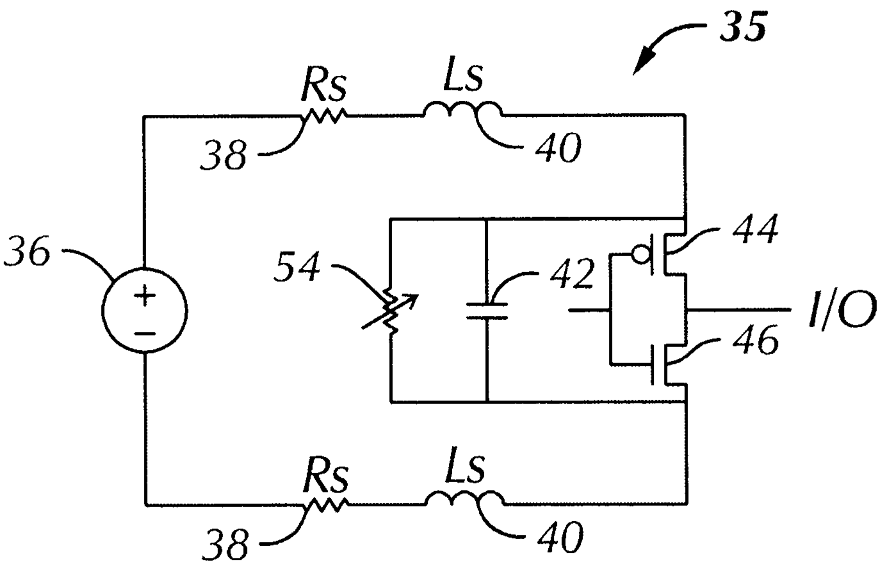
FIG. 8 shows a shunting resistance in accordance with an another embodiment of the present invention.

While each of these embodiments has shown the shunting device as a transistor, it should be clear to those of ordinary skill in the art that alternative shunting devices could be used. For example, a simple resistor located in parallel with the power supply of an I/O supply could perform the same function. Alternatively, a variable resistor 54 as shown in FIG. 8 could be used as well. Additionally, a simple switch could be added in series with the alternative type of resistance to control the shunting operation.

The ON/OFF signal 50 may be connected to an external circuit interface. In some embodiments, an industry standard interface such as "JTAG" could be used. However, any other suitable interface known to those of ordinary skill in the art could also be used. The purpose of the external interface is externally control of the shunt resistance. Alternatively, the ON/OFF signal 50 may be controlled by a particular computer program. In either event, the implementation of the ON/OFF signal 50 allows for greater flexibility in operating the circuit.

Advantages of the present invention may include one or more the following. In some embodiments, because a shunting device is positioned in parallel with a power supply of an I/O supply, the Q value of the I/O supply is reduced as opposed to when a shunting device is not used. This leads to reduced noise across the I/O supply and increased system performance.

In some embodiments, because a shunting device positioned in parallel to a power supply of an I/O supply is controllable, power consumption by the shunting device may be controlled and/or reduced.

In some embodiments, because a shunting device uses a resistance instead of a capacitance, less integrated circuit area space is used.

In some embodiments, because a shunting device is positioned across a power supply of an I/O supply, signal current to/from a transmission line through the I/O supply experiences less impedance than in cases where the shunt regulation device is not present.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for an I/O supply, comprising:

a power supply;

I/O output driver circuitry connected across terminals of the power supply;

a capacitance connected across terminals of the I/O output driver circuitry; and a shunting device connected in parallel with the power supply.

2. The apparatus of claim 1, wherein the shunting device comprises a transistor.

3. The apparatus of claim 1, wherein the shunting device comprises an N-type transistor.

4. The apparatus of claim 1, wherein the shunting device comprises a P-type transistor.

5. The apparatus of claim 1, wherein the shunting device is digitally activated and de-activated independent of the I/O supply.

6. The apparatus of claim 5, wherein the shunting device is activated and de-activated by a computer program.

7. The apparatus of claim 5, wherein the shunting device is activated and de-activated by an external signal.

8. The apparatus of claim 7, wherein the external signal is transmitted through an external system interface.

9. The apparatus of claim 8, wherein the external system interface is a JTAG.

* * * * *